United States Patent [19]

Cappelle et al.

[11] 3,994,177
[45] Nov. 30, 1976

[54] TELEVISION TUNER

[75] Inventors: Norman D. Cappelle, Arlington Heights; Walter Meyer, McHenry; Henry H. Tap, Cary, all of Ill.

[73] Assignee: Oak Industries Inc., Crystal Lake, Ill.

[22] Filed: Mar. 17, 1975

[21] Appl. No.: 558,729

Related U.S. Application Data

[62] Division of Ser. No. 414,326, Nov. 9, 1973, Pat. No. 3,898,879.

[52] U.S. Cl. .............................. 74/10 R; 64/1 V; 74/10.45; 334/50; 403/383
[51] Int. Cl.² .......................................... F16H 35/18
[58] Field of Search ............... 74/10 R, 10.45, 10.8, 74/10.85, 10.2; 403/383; 64/1 R, 1 C, 1 S, 1 V; 334/50

[56] References Cited
UNITED STATES PATENTS

| | | |
|---|---|---|
| 2,868,982 | 1/1959 | Carlson ............................. 334/51 |
| 3,240,182 | 3/1966 | Keneny ............................. 74/10 |
| 3,249,902 | 5/1966 | Warthan et al. ................... 334/50 |
| 3,679,252 | 7/1972 | Howle, Jr. ......................... 403/353 |
| 3,875,809 | 4/1975 | Lewkowicz ....................... 74/10 R |

Primary Examiner—Benjamin W. Wyche
Assistant Examiner—Randall Heald
Attorney, Agent, or Firm—Kinzer, Plyer, Dron & McEachran

[57] ABSTRACT

A TV tuner has a housing and a rotating channel selector shaft mounted on the housing. There are a plurality of individual support members positioned by and mounted on parallel flatted areas of the shaft, which flatted areas vary in size to assure correct placement of the support members. Individual coil strips, each carrying a tuning screw, are fixed to the shaft assembly. A simplified clutching arrangement for controlling adjustment of the screws utilizes a coil spring to provide the initial force for moving a pinion gear into operating engagement with the tuning screws. The tuning screws are held by resilient arms which bias the head of the screws toward the shaft to thus firmly maintain the screws in any adjusted position. Each of the coil strips have contacts extending outwardly from one side and positioned to be in electrical and mechanical contact with cantilever spring members fastened to a printed circuit board which in turn is held by the housing.

6 Claims, 15 Drawing Figures

U.S. Patent  Nov. 30, 1976  Sheet 1 of 4  3,994,177
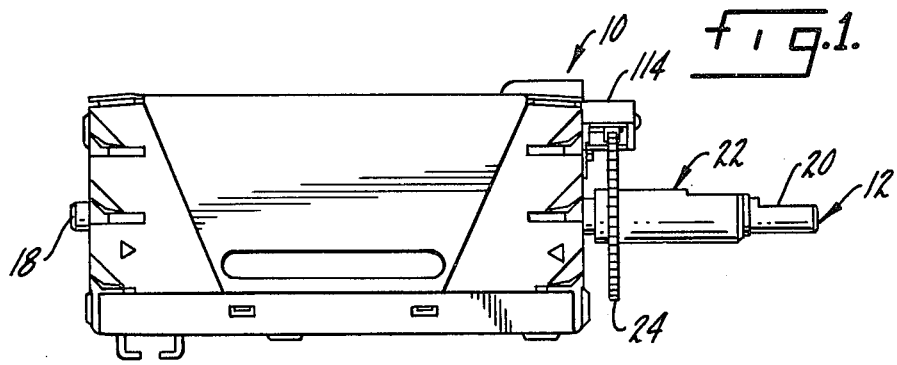
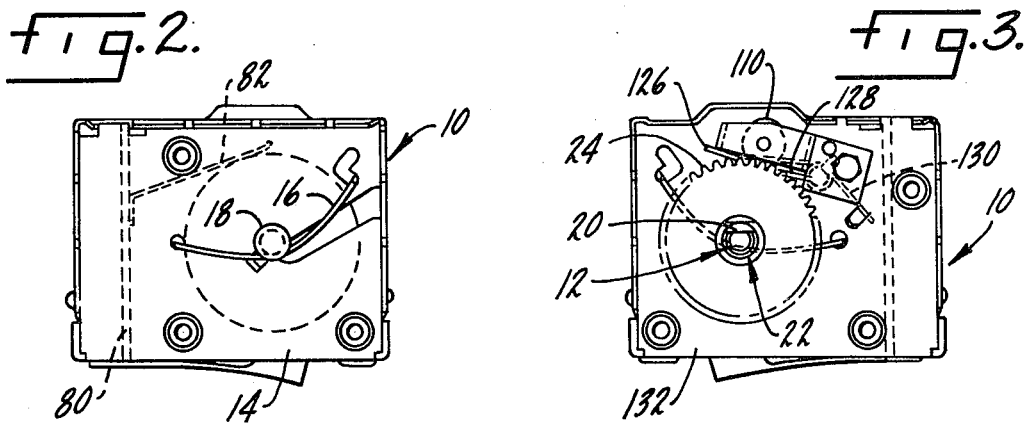
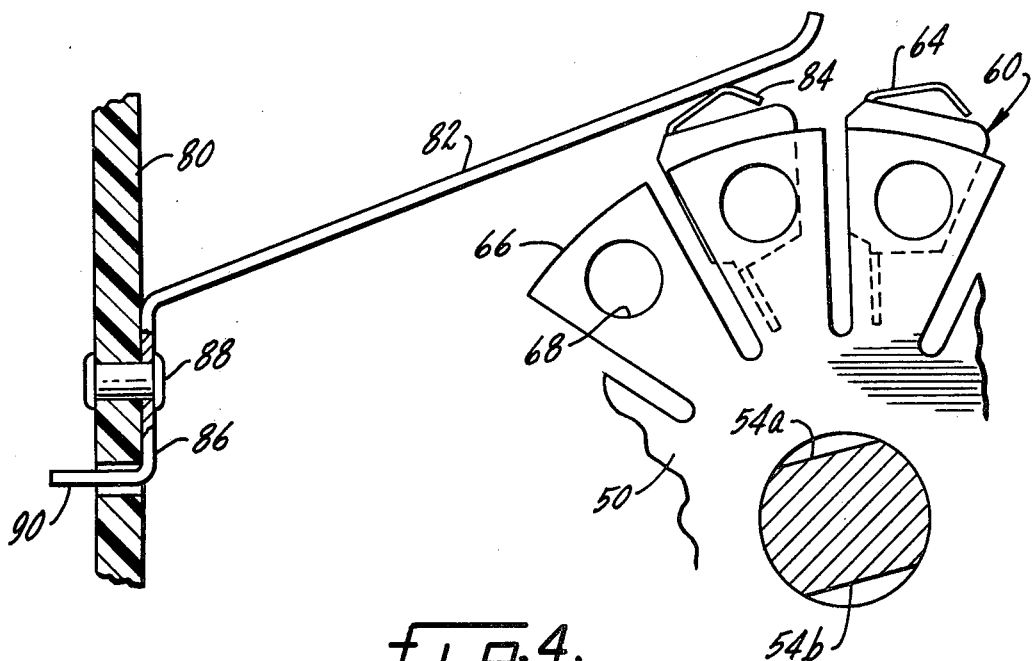

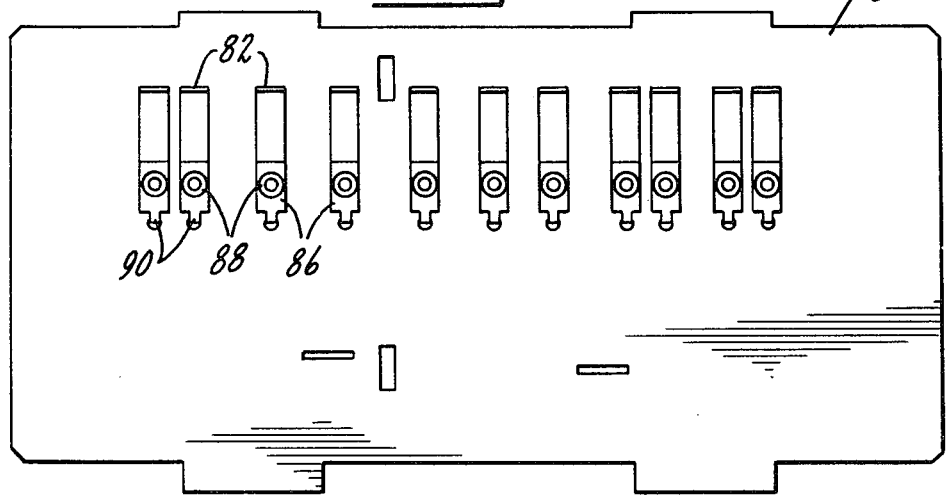
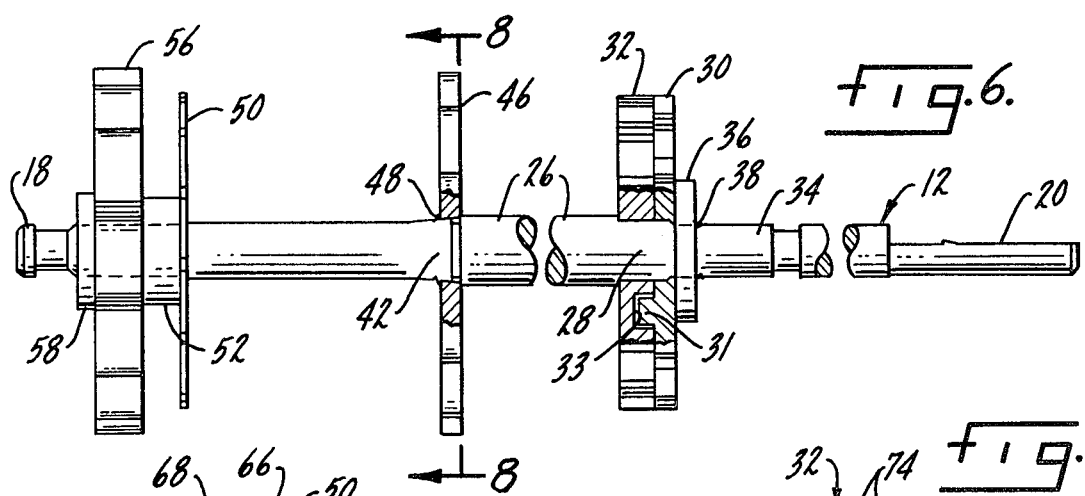
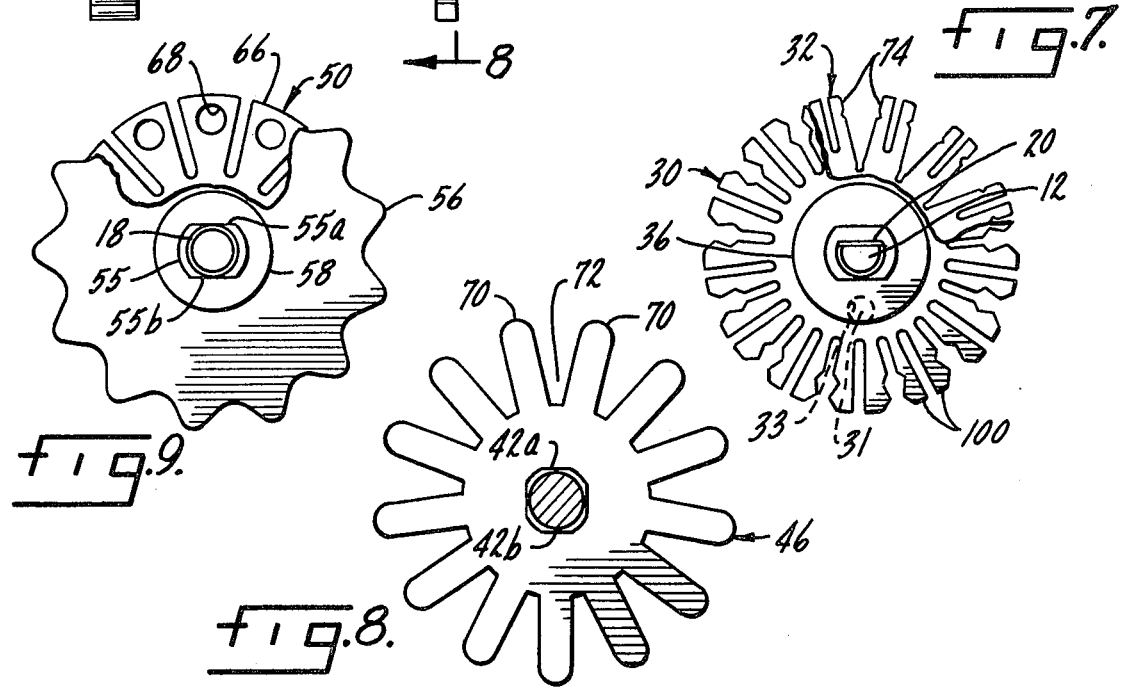

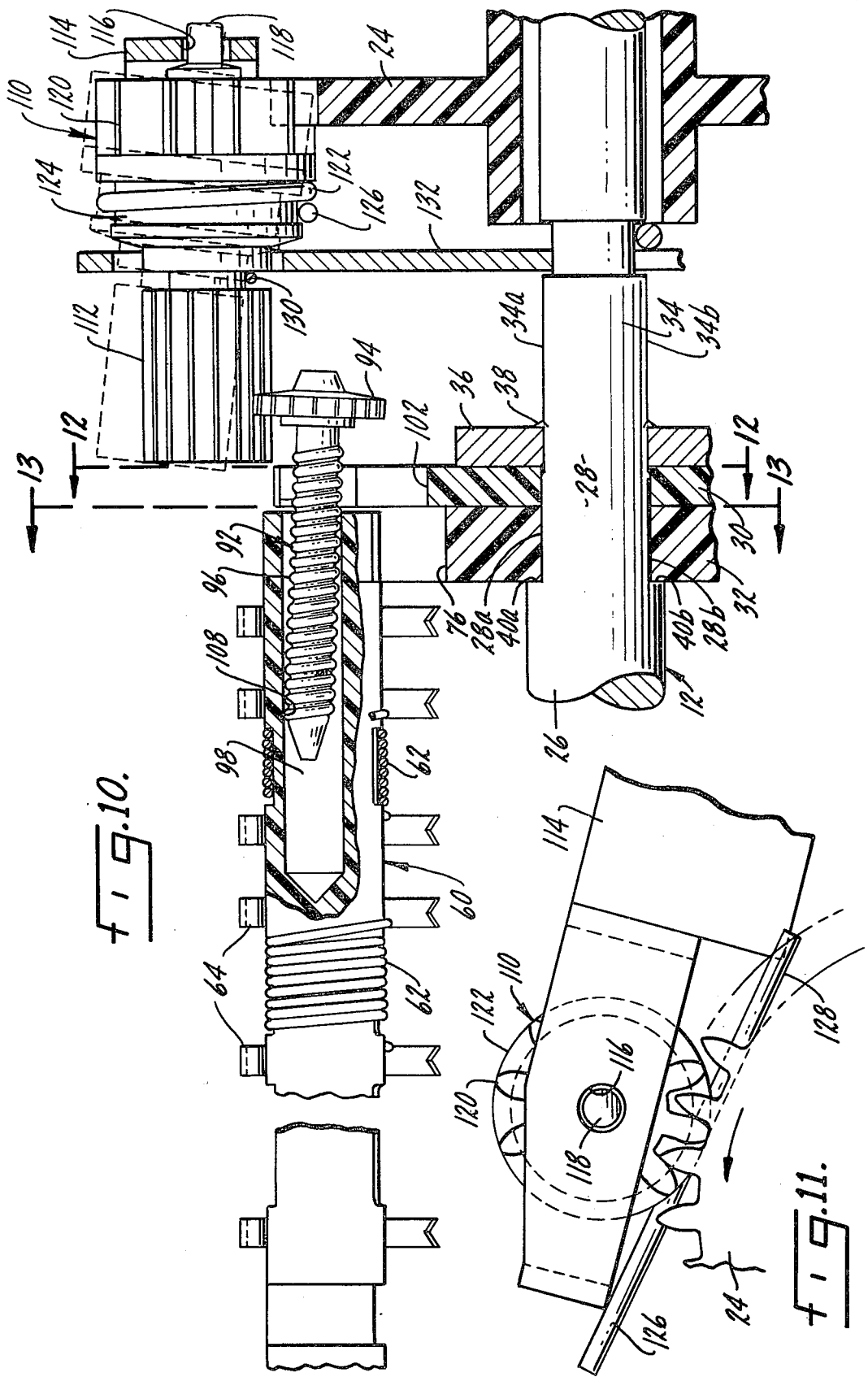

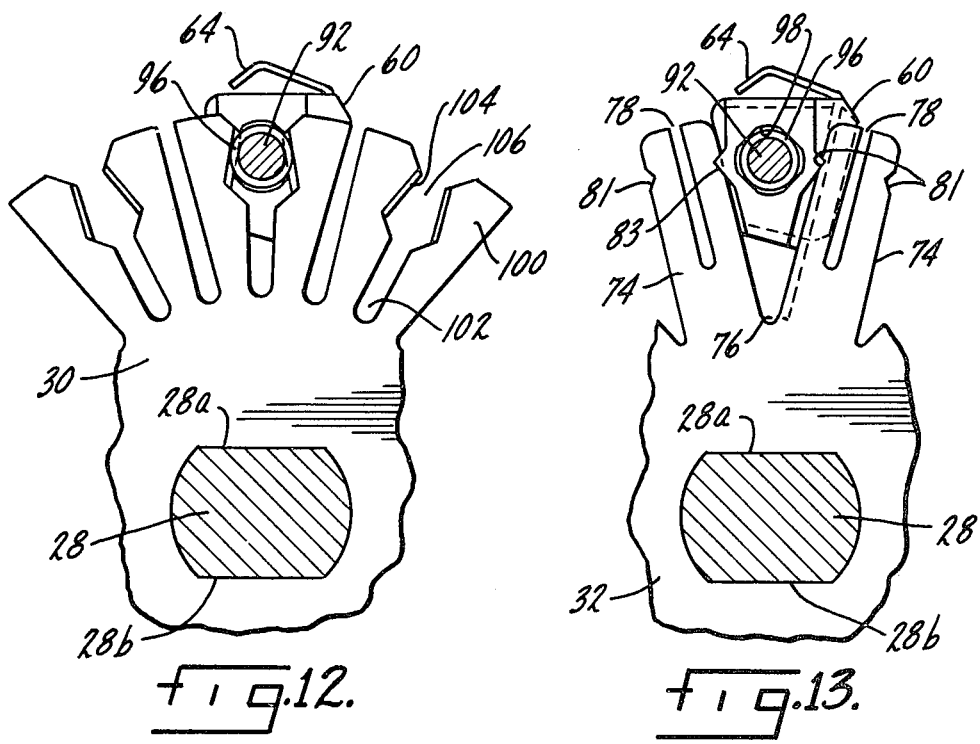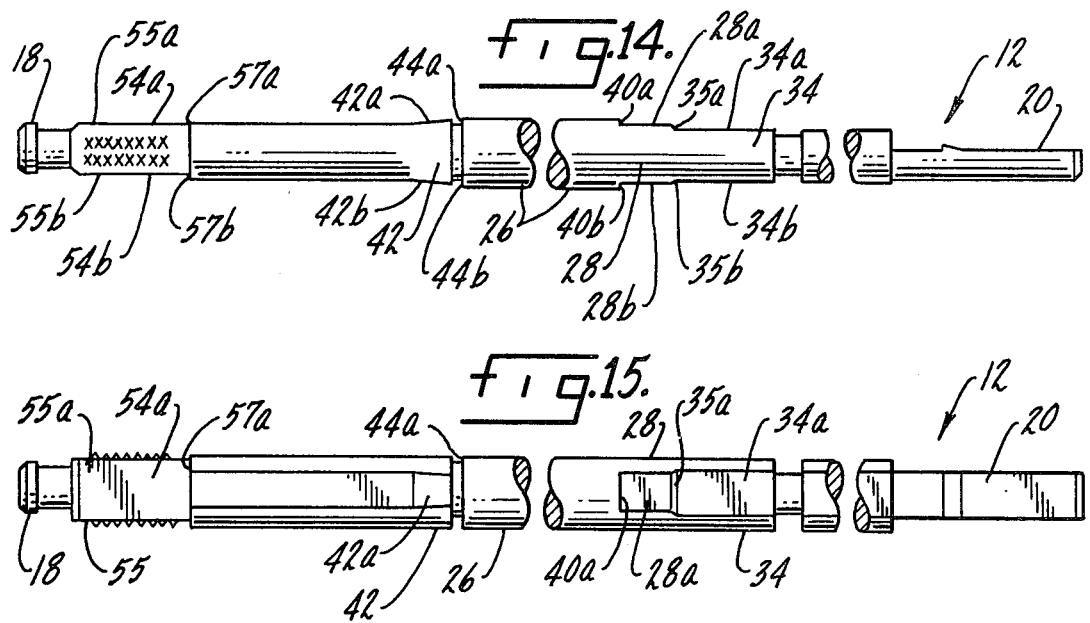

TELEVISION TUNER

This is a division of application Ser. No. 414,326, filed Nov. 9, 1973, now U.S. Pat. No. 3,898,879.

SUMMARY OF THE INVENTION

The present invention relates to turret type television tuners and in particular to improvements in the mechanical construction of such tuners.

One purpose of the invention is an improved contact mounting utilizing cantilever spring members individually positioned to be in mechanical and electrical contact with the contacts formed on individual tuning coil strips.

Another purpose is an improved means for mounting the coil strip support members and shield onto a rotating shaft utilizing parallel flatted areas, increasing in size from one end of the shaft toward the center to insure appropriate and rigid placement of the support members and shield on the shaft.

Another purpose is an improved fine tuning clutch arrangement utilizing a pivotally mounted gear and a coil spring functioning as a clutch in cooperation with the gear.

Another purpose is an improved means for mounting the fine tuning screws forming a part of the coil strips to insure smoothly operating fine tuning adjustment without any backlash or movement once the adjustment is completed.

Other purposes will appear in the ensuing specification, drawings and claims.

BRIEF DESCRIPTION OF THE DRAWINGS

The invention is illustrated diagrammatically in the following drawings wherein:

FIG. 1 is a side view of a tuner of the type described,

FIG. 2 is a back view of the tuner of FIG. 1,

FIG. 3 is a front view of the tuner,

FIG. 4 is an enlarged partial view showing a portion of the interior of the tuner, FIG. 5 is a plan view of the back of a printed circuit board used in the tuner, FIG. 6 is a plan view of the tuner shaft and coil strip support members, FIG. 7 is an end view, with portions broken away, of the oscillator screw retaining member and coil strip retainer, FIG. 8 is a section along plane 8—8 of FIG. 6, FIG. 9 is an end view, with portions broken away, showing the tuner detent wheel, FIG. 10 is an enlarged partial view illustrating the tuner adjustment screw and clutch and gear for operating the same, FIG. 11 is a partial enlarged view showing the relationship between the fine tuning gear and pinion, FIG. 12 is a section along plane 12—12 of FIG. 10, FIG. 13 is a section along plane 13—13 of FIG. 10, FIG. 14 is a side view of the shaft, and FIG. 15 is a top view of the shaft.

DESCRIPTIION OF THE PREFERRED EMBODIMENT

In FIG. 1, the tuner housing is indicated generally at 10, with the channel selector shaft being indicated generally at 12. The shaft 12 is journaled in the tuner back 14 and a spring 16 is used to hold the rear end 18 of the shaft 12 in proper position. At the front of the frame 10 the shaft extends outwardly and has a flatted area 20 for use in attaching a channel selector knob on a plastic shaft end insulator which in turn supports the channel selector knob. Adjacent the flatted area 20 is a fine tuning drive gear assembly 22, mounted on the shaft 12 and having a fine tuning drive gear 24 at one end.

Turning to FIG. 6, the shaft 12 has an intermediate portion 26, cylindrical in configuration and without any flatted areas. Immediately adjacent the right side of the intermediate portion 26 is a portion 28 having parallel flats 28a and 28b. The flatted areas form a double D shaft cross section. Mounted on the flatted area 28 is an oscillator screw retainer 30 and a rotor disc strip retainer 32.

Immediately adjacent the flatted area 28 is a second flatted area 34 having parallel flats 34a and 34b, which are slightly greater in chordal width, being closer to the center of the shaft than the flats 28a and 28b. A washer 36 is mounted on the flats 34a and 34b, abutting shoulders 35a and 35b. The washer 36 may be staked to the shaft, as indicated at 38, to thus hold the oscillator screw retainer 30 and the rotor disc strip retainer 32 in position on the shaft. The flatted areas 28a and 28b define shoulders 40a and 40b, with the rotor disc strip retainer being abutted against the shoulders which are effective to properly position and fix the elements 30 and 32 to the shaft. Thus, the shaft has double D sections of differing width, the shaft sections becoming progressively smaller in width in a direction away from the shaft end. Since the shaft flats are all parallel, all parts are maintained in the proper angular relationship relative to each other and the parts are firmly positioned and held on the shaft by the shoulers and the above-described staking operation. The elements 30 and 32 may be interlocked by a pin 31 and hole 33 on the respective elements to assure proper angular relation therebetween.

Immediately to the left of the intermediate shaft area 26 is a flatted area 42, again having parallel flat surfaces 42a and 42b, which cooperate with the shaft section 26 to form shoulders 44a and 44b. A center shield 46 is positioned on the flatted areas 42a and 42b, abutting the shoulders in the same manner as described above. The center shield may be staked, as indicated at 48, to fix it to the shaft. The press-fit and staking of the center shield to the switch shaft provides electrical continuity between these parts and thus provides electrical shielding between the various tuner sections.

At the far left end of the shaft 12 there is a strip retaining rotor spring 50 held in position against shoulders similar to those described by a washer 52 mounted on parallel flatted areas 54a and 54b. Adjacent the washer 52 is a detent wheel 56, positioned on flatted areas 55a and 55b, with the detent wheel being held in position against shoulers 57a and 57b by a washer 58. The double D area 55 has flatted areas of greater width than the flatted areas 54a and 54b. Double D area 42 in turn has flatted areas of less width than the flatted areas 54a and 54b. Thus, the double D areas having parallel flat areas of varying width insure correct and firm placement of the various described members.

The tuner may be of the turret type and utilizes a plurality of individual coil strips, each having appropriately placed and formed coils. As shown in FIG. 10, one of the coil strips is indicated at 60, having coils 62 positioned between contacts 64. There are a series of such contacts axially positioned along the coil strips 60 and there may be a plurality of coils, depending upon the particular TV channel, positioned axially along the length of the coil strip. Each of the coil strips is mounted at one end by the rotor strip retainer spring 50 and at the other end by the rotor disc strip retainer 32. The shield 46 assists in positioning the coil strips in the tuner.

FIG. 9 shows the details of the channel selector detent wheel 56 and the strip retaining rotor spring 50. The element 50 has a plurality of outwardly extending arms 66, each of which have a circular opening 68. The far left end of each of the coil strips 60 has a circular projection formed and adapted to pass through the opening 68 to hold the left-hand end of the coil strips in the member 50. The center shield 46 has a plurality of arms 70 defining intermediate V grooves 72. Each of the coil strips will be held in position by the arms 70 within the V grooves 72.

FIG. 13 shows the details of the coil strip retaining rotor disc 32. There are pairs of arms 74, with adjacent pairs of arms defining generally V-shaped grooves 76. The member 32 is preferably formed of a resilient plastic which is resilient, so that the right-hand end of the coil strips 60 may be positioned, as indicated in FIG. 13, within the grooves 76 and between the arm pairs 74. The center slot 78 in the pairs of arms 74 provide the necessary resilience to accomodate the inserted coil strips. When the coil strips are inserted, they tend to force the closest arm of each pair 74 outwardly tending to close the gap or slot 78, with the resiliency of the material of the member 32 providing the necessary holding force to retain the coil strips in position. Each side of arms 74 may have a notch 81 receiving projections 83 on the sides of the coil strip.

Each of the tuners will conventionally include electric circuitry, preferably mounted on a printed circuit board. Such a board is indicated diagrammatically in FIG. 4 at 80. A cantilever spring contact member 82 extends outwardly from the board 80 and is positioned to make electrical and mechanical contact with an outwardly extending end portion 84 of a coil strip contact 64. The cantilever springs have a flat portion 86, mounted by a rivet or the like 88 directly to the printed circuit board, with a tail portion 90 extending through the board for electrical connection to the circuit elements of the tuner. Of advantage in the design shown is that the relatively long cantilever spring arms 82 permit high contact pressure upon the contact portions 84, with low stress to the arm itself. This provides longer tuner life with the required contact pressure assuring reliability and quality of the tuner. FIG. 5 illustrates the printed circuit board 80 and the plurality of contact strips 82 which are disposed axially along the length of the P.C. board to be appropriately positioned for contact with the coil strip contacts 64.

Each of the coil strips 60 carries a tuning screw 92 having a head 94 and a threaded portion 96, with the threaded portion 96 being positioned within an axially extending coil strip passage 98. The oscillator screw retainer 30 mounts each of the oscillator adjusting screws 92, as shown particularly in FIG. 12. The screw retainer 30 has individual outwardly-extending arms 100, each pair of which define screw retaining gaps or slots 102. Each gap 102 has inwardly-directed lips 104 which define a tapered area 106, which tapered portion has a greater width at the inside than at the outside. Thus, as illustrated in FIG. 12, there will be an inwardly-directed bias on the shank or threaded portion 96 of the screw 92. The lips 104 are pressed against the sides of the screw thread to provide a non-slip screw guide. The tapering slot provides the inward bias which firmly holds the screw in an adjusted position. Note particularly, as in FIGS. 10 and 13, that the inward bias applied to the screw 92 causes the threaded portion 96 to be pushed against the top walls 108 of the generally diamond-shaped strip retainer passages 98. Since the oscillator screw retainer 30 is preferably formed of a resilient plastic material, the screws are firmly held, permitting no sidewise motion, but yet permitting a smooth turning motion for adjustment. The screw cannot move sideways because it is held by passage walls 108. It can be smoothly rotated as described hereinafter, and the application of the pinion gear to the screw does not cause any change in position of the screw relative to the coil strip. In addition, the mounting means shown, the spaced arms 100, permit easy removal of the gear headed screw and coil strip from the tuner for servicing.

The fine tune drive gear 24 is in mesh with a pinion gear indicated generally at 110 and including a gear head engaging surface 112 positioned for contact with the oscillator screw gear head 94. The pinion 110 is pivotally mounted on the housing by means of a bracket 114 which is fastened to the front of the housing and has an opening 116 receiving a round projection 118 on the end of the pinion opposite from the gear surface 112. The pinion 110 has a further gear surface 120 which is engagement with the fine tuning drive gear 24. A coil spring or clutch spring 122 is positioned about an intermediate portion 124 of the pinion 110, with the spring 122 having opposite end portions 126 and 128 positioned for contact with portions of the bracket 114. A return spring 130 is positioned inside of the tuner front wall 132 or on the opposite side of the front wall from the bracket 114. The return spring 130 normally retains the pinion 110 in the dotted line position of FIG. 10, or out of contact with the adjusting screw heads 94.

In operation, when it is desired to fine tune a particular TV channel, the fine tuning drive gear 24 is rotated by a conventional knob. When the drive gear is turned, the pinion 110 will be turned, as will the tight fitting clutch spring 122. However, its ends 126 and 128, being in contact with bracket 114, will cause the spring to create a force overcoming that of the return spring 130 and moving the pinion 110 to the full line position of FIG. 10. Thus, the intial rotating force applied to the drive gear causes the pinion to move into engagement with the oscillator adjusting screw head. Further turning force causes the pinion to rotate, thus rotating the adjusting screw. Thus, the clutch spring 122 creates the force tending to cause the pinion 110 to pivot into engagement with the oscillator adjusting screw head, with further turning permitting a frictional force or drag to be applied by the clutch spring, holding the gears in engagement.

Of importance in the invention is the tuner shaft and the means for mounting the various support members and center shield on the shaft. There are a series of double D shaft portions, with all of the flats on the shaft being parallel and with the flats varying in size so that the parts can only be assembled on the shaft in the appropriate axial manner. By having the flats parallel, the parts retain their appropriate relationship with each other. After the parts are positioned on the shaft, they are staked as a final operation.

The fine tuning clutch and gear arrangement is relatively simple, only involving a pinion and a clutch spring, with the pinion being pivotally mounted on a bracket attached to the housing. Initial movement of the fine tuning gear pivots the pinion into engagement with the adjusting screw head, with the pivoting force being provided by the clutch spring. The clutch spring further functions to provide sufficient frictional force to retain the gears in their appropriate position for adjusting the oscillator screws.

The oscillator screws are retained by a resilient arm which provides an inward bias to the screws, preventing any backlash and permitting easy removal of the coil strips for servicing. The force of the pinion gear engaging or disengaging the gear head screw does not cause the screw to move or change position because the screw is firmly diagonally held by the tapering slot formed by the arms 100 and by the walls of the diamond-shaped coil strip passage opening in the direction of force exerted by the pinion.

The cantilever springs are particularly advantageous for providing the electrical mechanical contact between the individual coil strips and the electrical circuitry forming a part of the tuner. The cantilever springs are long, permitting high contact pressure with low stress on the arms themselves. In addition, they provide for a relatively short electrical path and a minimum of hand wiring.

Whereas the preferred form of the invention has been shown and described herein, it should be realized that there may be many modifications, substitutions and alterations thereto.

The embodiments of the invention in which an exclusive property or privilege is claimed are defined as follows:

1. A TV tuner having a housing and a rotating shaft in said housing, a plurality of spaced radially extending support members mounted on said shaft, said shaft having parallel flat portions of differing width, with the portions of greatest width being adjacent an end of the shaft, a shoulder on the shaft at the end of each flat portion, at least some of said support members being positioned on separate flat portions and abutting said shoulders.

2. The structure of claim 1 further characterized in that a support member is positioned on each flat portion and abuts the shoulder at the end of the flat portion.

3. The structure of claim 2 further characterized in that said support members are mechanically fixed in position on said shaft.

4. The structure of claim 3 further characterized in that said support members are staked to the shaft from the side opposite the shoulder.

5. The structure of claim 1 further characterized in that at least some of said flat portions have an opposite, parallel, coextensive flat portion on the shaft.

6. The structure of claim 1 further characterized in that each of said flat portions are part of separate independent double D portions of said shaft.

* * * * *